United States Patent
Fisch et al.

(10) Patent No.: US 6,777,137 B2
(45) Date of Patent: Aug. 17, 2004

(54) EUVL MASK STRUCTURE AND METHOD OF FORMATION

(75) Inventors: Emily E. Fisch, Burlington, VT (US); Louis M. Kindt, Milton, VT (US); James P. Levin, South Burlington, VT (US); Michael R. Schmidt, Milton, VT (US); Carey T. Williams, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 10/064,401

(22) Filed: Jul. 10, 2002

(65) Prior Publication Data

US 2004/0009408 A1 Jan. 15, 2004

(51) Int. Cl.[7] .................................................. G03F 9/00
(52) U.S. Cl. ........................................................... 430/5
(58) Field of Search ................................ 430/5; 378/35

(56) References Cited

U.S. PATENT DOCUMENTS

| | | | |
|---|---|---|---|
| 4,440,841 A | 4/1984 | Tabuchi | 430/5 |
| 5,322,749 A | 6/1994 | Han | 430/5 |
| 5,928,817 A | 7/1999 | Yan et al. | 430/5 |
| 5,935,737 A | 8/1999 | Yan | 430/5 |
| 5,985,493 A | 11/1999 | Liddle et al. | 430/5 |
| 6,090,507 A | 7/2000 | Grenon et al. | 430/5 |
| 6,165,649 A | 12/2000 | Grenon et al. | 430/5 |
| 6,178,221 B1 | 1/2001 | Levinson et al. | 378/35 |
| 6,180,291 B1 | 1/2001 | Bessy et al. | 430/5 |
| 6,190,836 B1 | 2/2001 | Grenon et al. | 430/311 |
| 6,352,803 B1 * | 3/2002 | Tong et al. | 430/5 |
| 6,589,717 B1 * | 7/2003 | Ghandehari et al. | 430/322 |

* cited by examiner

*Primary Examiner*—S. Rosasco
(74) *Attorney, Agent, or Firm*—Schmeiser, Olsen & Watts; Richard M. Kotulak (57) ABSTRACT

An extreme ultraviolet lithography (EUVL) mask structure and associated method of formation. A first conductive layer is provided between a buffer layer and an absorber layer such that the buffer layer is on a multilayer stack. The multilayer stack is adapted to substantially reflect EUV radiation incident thereon. The absorber layer is adapted to absorb essentially all of EUV radiation incident thereon. A mask pattern is formed in the absorber layer. Formation of the mask pattern in the absorber layer is accompanied by inadvertent formation of a defect in the absorber layer. The defect is subsequently repaired. The mask pattern may be extended into the first conductive layer and into the buffer layer in a substantially defect-free process that exposes a portion of the multilayer stack. A second conductive layer may be provided on the absorber layer, wherein the mask pattern is also formed in the second conductive layer.

20 Claims, 9 Drawing Sheets

EUVL MASK STRUCTURE AND METHOD OF FORMATION

BACKGROUND OF THE INVENTION

1. Technical Field

The present invention relates to an extreme ultraviolet lithography (EUVL) mask structure and formation thereof.

2. Related Art

During fabrication of an extreme ultraviolet lithography (EUVL) mask structure, defects in the EUVL mask structure are inadvertently generated. Unfortunately, repair of such defects by use of, inter alia, a charged particle beam, a laser beam, etc. may modify the EUVL mask in a manner that impairs the effectiveness of the EUVL mask. Thus, there is a need for a structure and associated method that enables EUVL mask defects to be repaired without impairing the effectiveness of the EUVL mask.

SUMMARY OF THE INVENTION

The present invention provides a method of forming an extreme ultraviolet lithography (EUVL) mask structure, comprising:

providing a first conductive layer between a buffer layer and an absorber layer such that the buffer layer is on a multilayer stack that is adapted to substantially reflect EUV radiation incident thereon, and wherein the absorber layer is adapted to absorb essentially all of EUV radiation incident thereon;

forming a mask pattern in the absorber layer accompanied by inadvertent formation of a defect in the absorber layer; and repairing the defect.

The present invention provides an extreme ultraviolet lithography (EUVL) mask structure, comprising:

a multilayer stack adapted to substantially reflect EUV radiation incident thereon; and a first conductive layer between a buffer layer and an absorber layer such that the buffer layer is on the multilayer stack, wherein the absorber layer includes a mask pattern such that a portion of the first conductive layer is exposed, and wherein the absorber layer is adapted to absorb essentially all of EUV radiation incident thereon.

The present invention provides an extreme ultraviolet lithography (EUVL) mask, comprising:

a multilayer stack adapted to substantially reflect EUV radiation incident thereon; and a first conductive layer between a buffer layer and an absorber layer such that the buffer layer is on the multilayer stack, wherein a mask pattern in each of the absorber layer, first conductive layer, and buffer layer collectively exposes a portion of the multilayer stack, wherein the absorber layer is adapted to absorb essentially all of EUV radiation incident thereon, and wherein the absorber layer, first conductive layer, and buffer layer are essentially defect free.

The present invention provides an EUV structure and associated method of formation that enables EUVL mask defects to be repaired without impairing the effectiveness of the EUVL mask.

In the specification and claims herein, "conductive" means electrically conductive and "non-conductive" means not electrically conductive.

DETAILED DESCRIPTION OF THE INVENTION

Extreme ultraviolet lithography (EUVL) requires fabrication of EUVL masks. The EUVL mask is the first reflective mask to be deployed for lithography. In first embodiments described by FIGS. 1A–1F, the EUVL mask of the present invention comprises: a substrate, a multilayer stack on the substrate, a non-conductive buffer layer on the multilayer stack, a conductive layer on the buffer layer, and an absorber layer on the conductive layer. In second embodiments described by FIGS. 2A–2F, the EUVL mask of the present invention is the same as the EUVL mask of the first embodiments of FIGS. 1A–1F, with the addition of a second conductive layer on the absorber layer. In third embodiments described by FIGS. 3A–3E, the EUVL mask of the present invention is the same as the EUVL mask of the first embodiments of FIGS. 1A–1F, with the buffer layer removed and with the conductive layer providing the functionality of both the buffer layer and the conductive layer of FIGS. 1A–1F to prevent charge accumulation during imaging and repair.

The final EUVL mask comprises essentially absorbing regions and reflective regions. The essentially reflective regions in the final EUVL mask exist where portions of the absorber layer (and corresponding portions of the underneath conductive layer and buffer layer) have been removed. The absorbing regions in the final EUVL mask exist where portions of the absorber layer (and corresponding portions of the underneath conductive layer and buffer layer) have been preserved (i.e., not removed). The absorbing regions (and corresponding portions of the underneath conductive layer and buffer layer) and reflective regions collectively constitute an "absorbing stack" that defines the desired mask pattern.

During fabrication of the EUVL mask, defects may be formed. Absorbing features may be left in reflective regions and are called "opaque defects." Reflective features may be created in absorbing regions and are called "clear defects." Foreign materials may also be present and are called "foreign material defects." Clear defects, opaque defects, and foreign material defects are subsequently "repaired" (i.e., essentially removed such that the defects, after repair, do not create serious reflection distortions when EUV radiation is applied to the final EUVL mask). Note that the repair patches are part of the absorbing stack that defines the desired mask pattern.

Without the conductive layer between the absorber layer and the buffer layer, the use of a beam of charged particles for repairing such defects would cause a buildup of electric charge in the non-conductive buffer layer. The electric charge that builds up in the non-conductive buffer layer eventually discharges, which inhibits effective beam control for both imaging and defect location/repair. There may even be sufficient electric charge resulting from the beam of charged particles to cause electrostatic damage to the absorber layer and/or the multilayer stack. The conductive layer between the absorber layer and the buffer layer, as disclosed in the first and second embodiments of the present invention, creates a conductive path for the charged particles and prevents charge accumulation. In the third embodiments of the present invention, the conductive layer also serves as an alternative buffer layer and there can be no charge buildup in said alternative buffer layer, because said alternative buffer layer is conductive.

For the purpose of the present invention, EUV radiation is defined herein as encompassing a wavelength range of about 5 nanometers (nm) to about 25 nm. An EUV wavelength of particular interest herein is the EUV wavelength of 13.4 nm, because there are several radiation sources appropriate for lithography at the 13.4 nm wavelength.

Figure 1A:
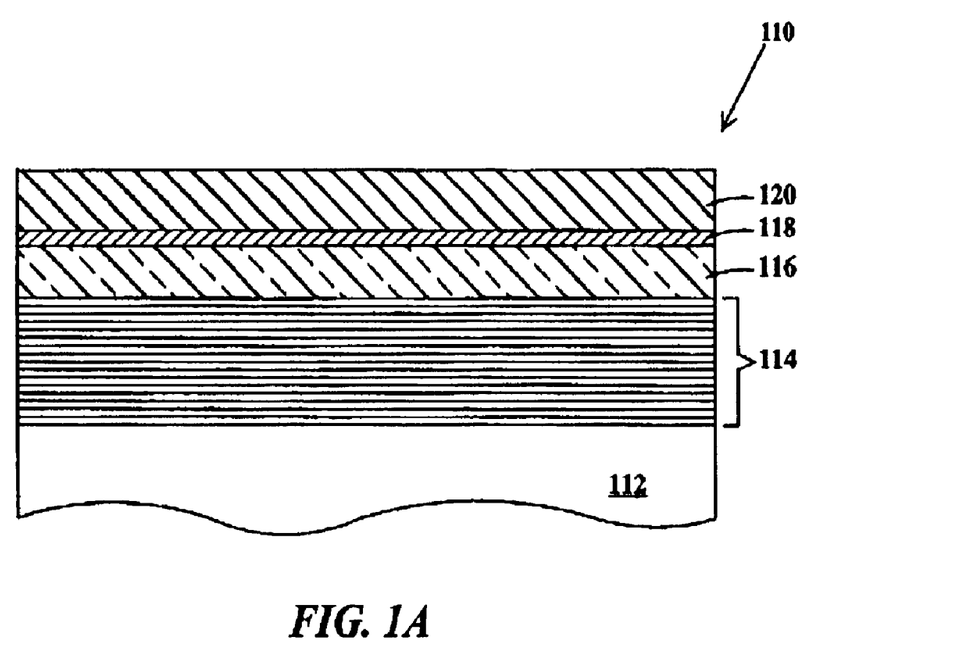
FIG. 1A depicts a front cross-sectional view of an extreme ultraviolet lithography (EUVL) mask structure comprising a multilayer stack on a substrate, and a conductive layer between a buffer layer and an absorber layer such that the buffer layer is on the multilayer stack, in accordance with first embodiments of the present invention.

FIG. 1A depicts a front cross-sectional view of an extreme ultraviolet (EUV) mask structure 110 comprising a multilayer stack 114 on a substrate 112, and a conductive layer 118 between a buffer layer 116 and an absorber layer 120 such that the buffer layer 116 is on the multilayer stack 114, in accordance with first embodiments of the present invention.

The substrate 112 comprises a low thermal expansion material having a coefficient of thermal expansion (CTE) not exceeding about 30 ppb/Å° C. The substrate 112 is prepared so that the substrate 112 provides a flat, rigid surface for supporting the multilayer stack 114 and also prevents image placement errors due to heating. The substrate 112 must be dimensionally stable under the mechanical, chemical, and thermal stresses that it is subjected to during fabrication and usage. The substrate 112 may have any dimensions known to a person of ordinary skill in the art such as, inter alia, 6 inches×6 inches×25 inches.

The multilayer stack 114 is a Bragg mirror having a composition and thickness so as to substantially reflect EUV radiation incident on the multilayer stack 114. Substantially reflecting EUV radiation incident on the multilayer stack 114 is defined herein as reflecting at least about 65% of the energy associated with said EUV radiation that is incident on the multi layer stack 114. The multilayer stack 114 may comprise alternating sheets of silicon (Si) and molybdenum (Mo). Said combination of Si and Mo provides a high peak reflectivity at an EUV source wavelength of 13.4 nm. The number of alternating sheets is application dependent and a representative number of such sheets is 80 sheets (i.e., 40 sheets of Si alternating with 40 sheets of Mo). The sheets may have a pitch (i.e., distance between two adjacent sheets) that is application dependent and a representative pitch is about 7 nm. The pitch may be a constant pitch or a variable pitch. The temperature at which the multilayer stack 114 is subjected to should be low enough (such as, inter alia, below 150° C., depending on the multilayer stack 114 material composition) to prevent damage to the multilayer stack 114. The multilayer stack 114 may have other compositions than the aforementioned alternating sheets of Si and Mo, so long as the substantial reflectivity requirement is satisfied. The multilayer stack 114 may include a top layer, called a "capping layer," whose purpose is to protect the alternating sheets of the multilayer stack 114 from damage (e.g., from oxidation damage, corrosion damage, etc.) and also to enhance the reflectivity of the multilayer stack 114 with respect to the incident EUV radiation. The capping layer may comprise silicon or other material consistent with the multilayer stack 114 being able to substantially reflect EUV radiation incident thereon. The multilayer stack 114, together with the substrate 112 on which the multilayer stack 114 is deposited, is called an "EUVL mask blank."

The non-conductive buffer layer 116 may comprise a non-conductive material such as, inter alia, an oxide (e.g., silicon dioxide) that can be etched. The buffer layer 116 may comprise a material that can serve as an etch stop in conjunction with etching the absorber layer 120. The buffer layer 116 may have a composition such that the buffer layer 116 is capable of being wet etched or etched by other methods such as reactive ion etch (RIE). Although anisotropic etches may be advantageously used, there are applications for which isotropic removal (e.g., isotropic etching) of portions of the buffer layer 116 is appropriate. The buffer layer 116 has a thickness between about 5 Å and about 5000 Å. The buffer layer 116 may be formed on the multilayer stack 114 by any method known to a person of ordinary skill in the art such as by, inter alia, sputtering or chemical vapor deposition. However, the substrate 112 is kept at a temperature low enough (such as, inter alia, below 150 Å° C., depending on the multilayer stack 114 material composition) to prevent damage to the multilayer stack 114. The buffer layer 116 serves to protect the multilayer stack 114 during subsequent processing, such as during repair of defects in the absorber layer 120. The buffer layer 116 may also: serve as an etch stop layer during formation of a space pattern of openings in the absorber layer 120 and/or conductive layer 118, control etching of the absorber layer 120, and minimize damage associated with over-etching the absorber layer 120. The buffer layer 116 may also serve as a sacrificial layer that prevents damage (e.g., damage that could be physical, thermal, or particulate in nature), wherein said damage may result from repair of defects in the absorber layer 120. For example, a focused ion beam of gallium ions used in repairing opaque defects in the absorber layer 120 may generate a "gallium stain" in a portion of the buffer layer 116, wherein said portion of the buffer layer 116 will be subsequently etched away to expose a portion of the multilayer stack 114 in accordance with the desired mask pattern, as will be described infra.

The conductive layer 118 comprises a conductive material such as, inter alia, a metal or a metallic alloy (e.g., copper, tantalum nitride, chrome, or a chrome alloy). As stated supra, the conductive layer 118 serves to electrically shield the buffer layer 116 from a charge buildup therein, wherein the charge buildup would otherwise result from the use of a beam of charged particles for repairing defects in the absorber layer 120. The conductive layer 118 may also serve as an etch stop in conjunction with subsequent etching of portions of the absorber layer 120. Additionally, the conductive layer 118 may serve to prevent "riverbedding" that may occur when defects are removed, as will be discussed infra. Also, the conductive layer 118 may serve to prevent generation of repair-induced stains in the buffer layer 116. For example, gallium stains might be generated during repair of opaque defects in the absorber layer 120.

The conductive layer 118 may have a small thickness such as, inter alia, between about 50 Å and about 100 Å, in order to making it relatively easy to subsequently remove portions of the conductive layer 118, such as by use of wet etching, in a manner that is selective with respect to the absorber layer 120 (i.e., without etching the absorber layer 120). Wet etching of a copper layer may be accomplished with, inter alia, nitric acid or another acid solution that etches the copper layer. If the conductive layer 118 comprises copper and the absorber layer 120 comprises chrome, the aforementioned wet etch solutions effectively etch the copper while being selective with respect to the chrome.

The conductive layer 118 may alternatively have a thickness between about 5 Å and about 1000 Å, wherein portions of the conductive layer 118 may be subsequently etched away by any anisotropic dry etch process known to one of ordinary skill in the art such as by, inter alia, a reactive ion etching (RIE) process. The upper limiting thickness of about 1000 Å is dictated by the requirement that the conductive layer 118 and the absorber layer 120, in combination, should not be thicker than can be used to create a fine image line during EUV imaging at the EUV wavelength used. Thus when the conductive layer 118 is very thick (e.g., in a proximity of about 1000 Å), then the absorber layer 120 should be correspondingly thin (e.g., less than about 100 Å) such that the combined thickness of the conductive layer 118 and the absorber layer 120 is about 1000 Å or less. The upper limiting thickness of about 1000 Å is thus merely exemplary for some EUV wavelengths and absorber materials, and the combined thickness of the conductive layer 118 and the absorber layer 120 generally is not limited to about 1000 Å. Thus the combined thickness of the conductive layer 118 and the absorber layer 120 may exceed about 1000 Å, depending on the EUV wavelengths and absorber materials utilized. The conductive layer 118 may be formed on the buffer layer 16 by any method known to a person of ordinary skill in the art such as by, inter alia, focused ion beam (FIB) sputtering, FIB deposition, laser deposition etc. The absorber layer 120 includes one or more sublayers with each sublayer comprising an absorber material and a thickness such that the absorber layer 120 is adapted to absorb essentially all of EUV radiation incident thereon (i.e., absorption of at least about 99% of the energy of said EUV radiation incident thereon). The absorber material may comprise, inter alia, chromium, tantalum nitride (TaN), titanium nitride (TiN), titanium (Ti), tantalum (Ta), or Al—Cu. Thus, the minimum thickness of the absorber layer 120 depends on the absorber material absorptivity at the EUV wavelength utilized. A representative absorber layer 120 thickness is about 1000 Å or less. The absorber layer 120 may be formed on the conductive layer 118 by any method known to a person of ordinary skill in the art such as by, inter alia, sputtering, or chemical vapor deposition.

Figure 1B:
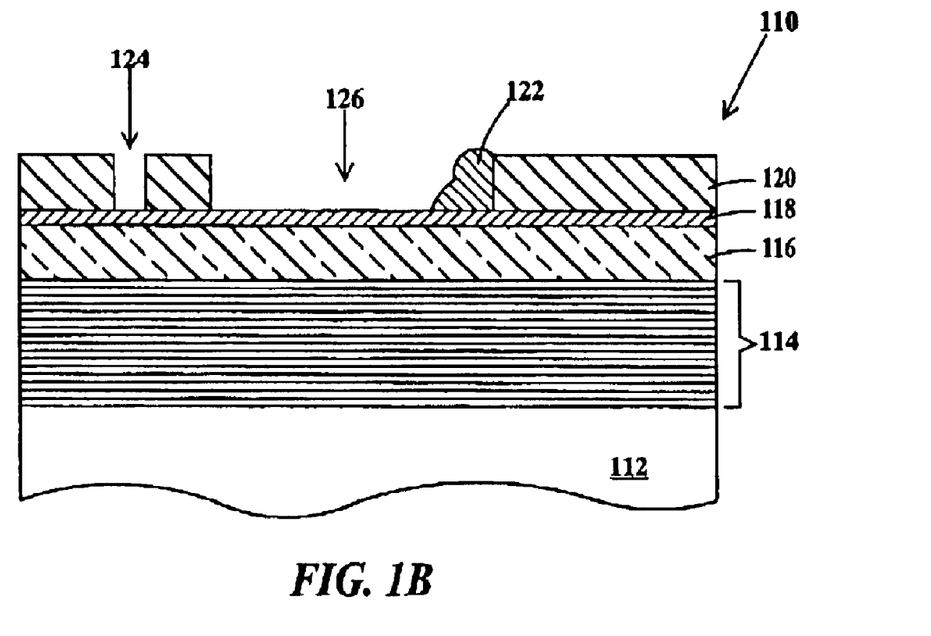
FIG. 1B depicts the EUVL mask structure of FIG. 1A after transfer of a mask pattern to the absorber layer such that defects have been inadvertently created in the absorber layer, in accordance with first embodiments of the present invention.

FIG. 1B depicts the EUVL mask structure 110 of FIG. 1A after a mask pattern is formed and then transferred to the absorber layer 120 such that defects have been inadvertently created in the absorber layer 120, in accordance with first embodiments of the present invention. The mask pattern is formed, using photolithography, by first applying a photoresist layer (not shown in FIG. 1A or FIG. 1B) on the absorber layer 120 in accordance with the mask pattern to be formed.

Then, the photoresist layer is developed after being exposed to an electron beam or to light, resulting in formation of the mask pattern in the photoresist layer. Next, the mask pattern is transferred from the photoresist layer to the absorber layer 120 by selectively removing absorber layer material in accordance with the mask pattern, which results in a space pattern 126 in the absorber layer 120 and which may inadvertently create defects (e.g., clear defects, opaque defects, and foreign material defects, as discussed supra) in the absorber layer 120. Once the space pattern 126 is transferred from the photoresist layer to the absorber layer 120, the photoresist layer is removed. The space pattern 126 in the absorber layer 120 may be formed by any method known to a person of ordinary skill in the art such as by, inter alia, wet etching or RIE. Thus the mask pattern that has been transferred to the absorber layer 120 includes the space pattern 126. The conductive layer 118 may serve as etch stop for the aforementioned etching by RIE of the absorber layer 120 to form the space pattern 126. If the conductive layer 118 is too thin to effectively serve as an etch stop, then the aforementioned etching by RIE of the absorber layer 120 may be timed to stop before removing the entire conductive layer 118. The space pattern 126 will be subsequently extended into the conductive layer 118 (see FIG. 1E and accompanying description) and the buffer layer 116 (see FIG. 1F and accompanying description) in order to provide a path through which EUV radiation may travel toward, and be incident upon, the multilayer stack 114.

FIG. 1B depicts a clear defect 124 and an opaque defect 122. The clear defect 124 may be formed by an unintentional removal of some absorber material in the absorber layer 120 during formation of the space pattern 126. The clear defect 124 may be caused by an overly developed area in the photoresist used to pattern the absorber layer 120, and consequent unintended etching of the area that has become the location of the clear defect 124. The opaque defect 122 may be formed by an unintentional failure to remove some absorber material in the absorber layer 120 during formation of the space pattern 126. The opaque defect 122 may be caused by inadequate development in the photoresist used to pattern the absorber layer 120, and consequent creation of a masking effect in an area intended to be opened (i.e., the area that has become the location of the opaque defect 122). As explained supra, the clear defect 124, the opaque defect 122, and foreign material defects must be repaired. Repairing a clear defect comprises filling the clear defect with material (e.g., styrene, carbon patch material, an absorbent metal, etc.) that is highly absorbent of incident EUV radiation at the wavelength of the incident EUV radiation. Repairing an opaque defect or a foreign material defect comprises removing the unwanted material of the defect. A focused ion beam (FIB), a charged particle beam (e.g., an electron beam), or a laser beam may be used for repairing: an opaque defect, a foreign material defect., and a clear defect in the presence of appropriate deposition gases. Such appropriate deposition gases may include, inter alia: methylcyclopentadienyl platinum (CH3C5H4)Pt(CH3)3 for patching with platinum (Pt); styrene for patching with carbon; tetramethylcyclotetrasiloxane and an oxidizer such as O2 gas for patching with SiO2; tungstenhexacarbonyl for patching with tungsten. For removal of an opaque defect or a foreign material defect by any of the aforementioned methods, such removal may be assisted by use of a gas such as, inter alia, xenon difluoride (XeF2). All techniques described herein for removing opaque defects may also be used for removing foreign material defects.

Figure 1C:
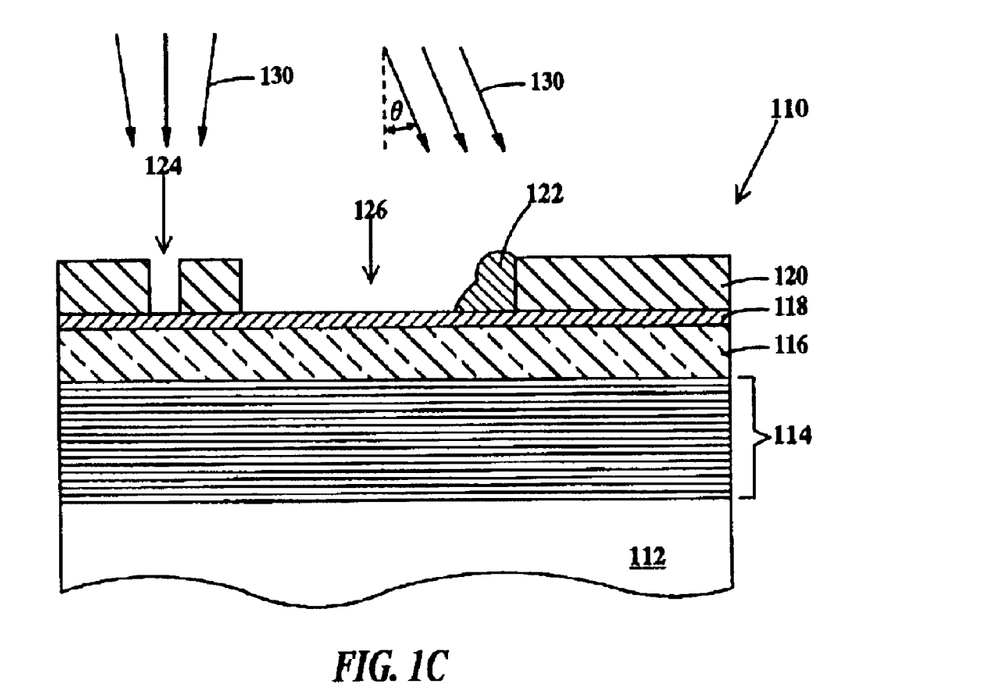
FIG. 1C depicts the EUVL mask structure of FIG. 1B with a focused ion beam for repair of the defects, in accordance with first embodiments of the present invention.

FIG. 1C depicts the EUVL mask structure 110 of FIG. 1B with FIB 130 for repair of the clear defect 124 and the opaque defect 122, in accordance with first embodiments of the present invention. The FIB 130 may comprise a beam of gallium ions. The present invention also contemplates using smaller charged particles such as, inter alia, krypton ions or electrons. The present invention additionally contemplates using a laser beam for repair of the opaque defect 122 or a foreign material defect, and for repair of the clear defect 124 in the presence of appropriate deposition gases. Such appropriate deposition gases may include, inter alia: methylcyclopentadienyl platinum (CH3C5H4)Pt(CH3)3 for patching with platinum (Pt); styrene for patching with carbon; tetramethylcyclotetrasiloxane and an oxidizer such as O2 gas for patching with SiO2; tungstenhexacarbonyl for patching with tungsten. For removal of an opaque defect or a foreign material defect, such removal may be assisted by use of a gas such as, inter alia, xenon difluoride (XeF2).

Use of the FIB 130 for repairing the opaque defect 122 may generate "riverbedding" which constitutes damage to the buffer layer 116 due to the high acute angularity of the FIB 130 at the peripheral portion of the opaque defect 122. Riverbedding refers to trench formation in the substrate 112 at the edge of etched features. Such trenches can be created during pattern formation (such as by RIE as described supra) or during defect removal. The FIB 130 sputters material away at a rate determined by such factors as the ionic mass, the voltage that accelerates the ions, and the angle of incidence Î, of the ions. Î, is relatively large at the center of the opaque defect 122 and approaches a very small acute angle at the periphery of the opaque defect 122. As Î, becomes very small, the sputter rate may increases approximately sevenfold at the periphery relative to the center of the opaque defect 122, which causes the riverbedding near the periphery of the opaque defect 122. The conductive layer 118, if sufficiently thick, may prevent or reduce such riverbedding by not permitting the highly angled charged particles of the FIB 130 to penetrate to the buffer layer 116.

While FIG. 1C depicts repair of the clear defect 124 and the opaque defect 122 by use of the FIB 130, the clear defect 124 and the opaque defect 122 may be repaired by any method known to a person of ordinary skill in the art such as, inter alia, by use of a beam of charged particles or by use of a laser beam.

Figure 1D:
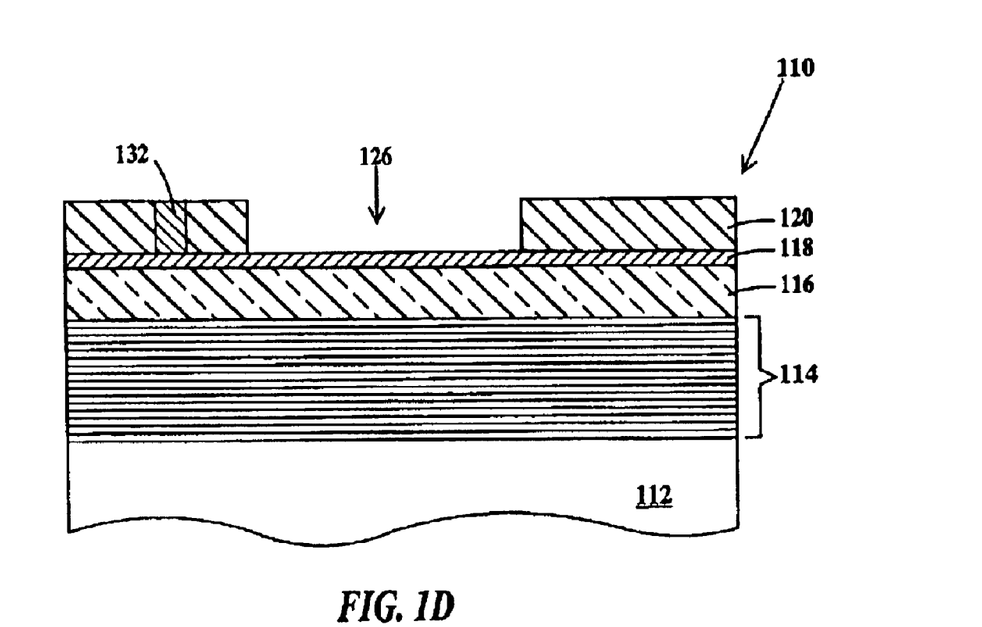
FIG. 1D depicts the EUVL mask structure of FIG. 1C after repair of the defects, in accordance with first embodiments of the present invention

FIG. 1D depicts the EUVL mask structure 110 of FIG. 1C after repair of the clear defect 124 and the opaque defect 122 as described supra in conjunction with FIG. 3C, in accordance with first embodiments of the present invention. FIG. 1D shows repair material 132 as replacing the clear defect 124. As discussed supra, the repair material 132 (e.g., styrene, carbon patch material, an absorbent metal, etc.) is highly absorbent of incident EUV radiation at the wavelength of the incident EUV radiation.

Figure 1E:
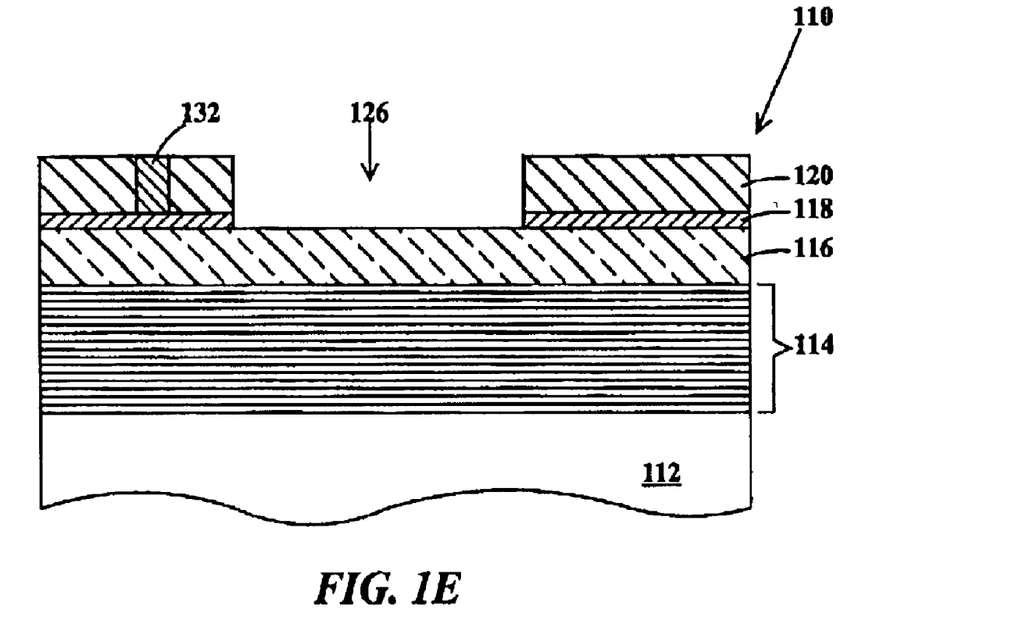
FIG. 1E depicts the EUVL mask structure of FIG. 1D after extension of the mask pattern into the conductive layer, in accordance with first embodiments of the present invention.

FIG. 1E depicts the EUVL mask structure 110 of FIG. 1D after extension of the mask pattern (including extension of the space pattern 126) into the conductive layer 118, by wet etching or dry etching (e.g., RIE) as discussed supra in conjunction with FIG. 1A, in accordance with first embodiments of the present invention. Said etching of the conductive layer 118 may be selective with respect to the absorber region 120 in order to avoid damage to the absorber region 120.

Figure 1F:
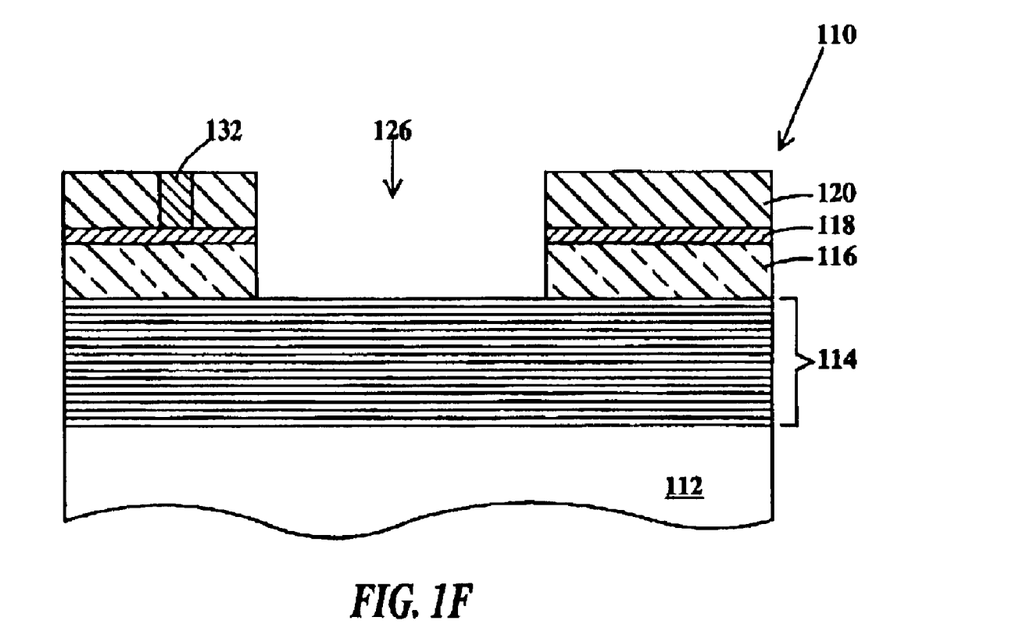
FIG. 1F depicts the EUVL mask structure of FIG. 1E after extension of the mask pattern into the buffer layer such that a portion of the multilayer stack is exposed, in accordance with first embodiments of the present invention.

FIG. 1F depicts the EUVL mask structure 110 of FIG. 1E after extension of the mask pattern (including extension of the space pattern 126) into the non-conductive buffer layer 116 such that a portion of the multilayer stack 114 is exposed, in accordance with first embodiments of the present invention. The mask pattern with space pattern 126 may be extended into the buffer layer 116 by any process known to one of ordinary skill in the art such as by, inter alia, a wet etch or a dry etch such as RIE. Said etching of the buffer layer 116 may be selective with respect to the absorber layer 120 in order to avoid damage to the absorber layer 120.

If the mask pattern that includes the space pattern 126 is extended into the conductive layer 118 and the buffer layer 116 by independently etching the conductive layer 118 and the buffer layer 116, then the process of etching the conductive layer 118 should be selective with respect to the buffer layer 116 the absorber layer 120. If the mask pattern that includes the space pattern 126 is extended into both the conductive layer 118 and the buffer layer 116 by applying a same etching process to both the conductive layer 118 and the buffer layer 116, then application of said same etching process to the conductive layer 118 should not be selective with respect to the buffer layer 116, but should still be selective with respect to the absorber layer 120.

After the mask pattern with space pattern 126 has been extended into the buffer layer 116 such that a portion of the multilayer stack 114 is exposed as depicted in FIG. 1F, the mask structure 110 has become an EUVL mask that is essentially defect free.

Figure 2A:
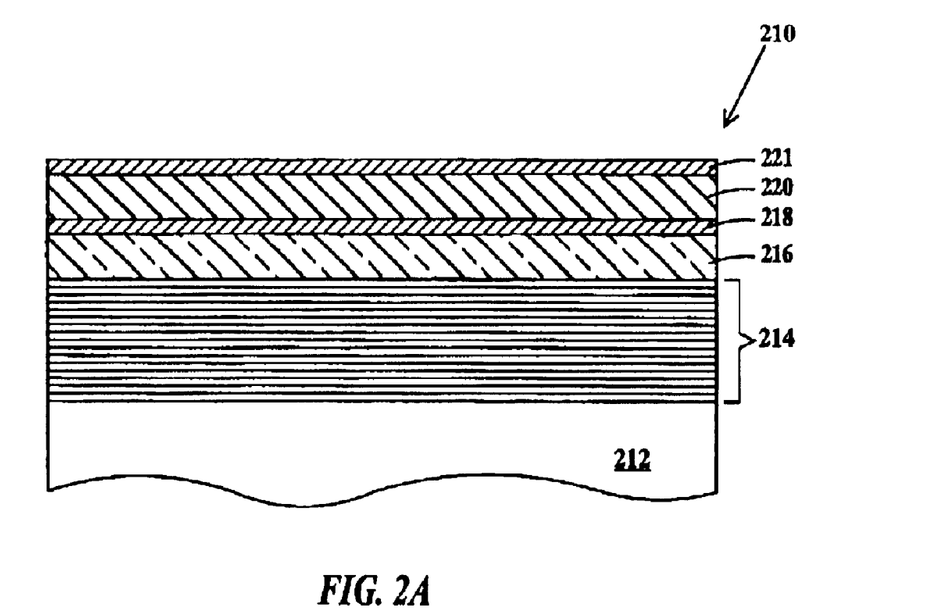
FIG. 2A depicts a front cross-sectional view of an EUVL mask structure comprising a multilayer stack on a substrate, a first conductive layer between a buffer layer and an absorber layer such that the buffer layer is on the multilayer stack, and a second conductive layer on the absorber layer, in accordance with second embodiments of the present invention.

FIG. 2A depicts a front cross-sectional view of an EUVL mask structure 210 comprising a multilayer stack 214 on a substrate 212, a conductive layer 218 between a buffer layer 216 and an absorber layer 220 such that the buffer layer 216 is on the multilayer stack 214, and a conductive layer 221 on the absorber layer 220, in accordance with second embodiments of the present invention. The substrate 212, multilayer stack 214, buffer layer 216, conductive layer 218, and absorber layer 220 of FIG. 2A respectively correspond (with respect to geometry, materials and material properties, functionality, etc.) to the substrate 112, multilayer stack 114, buffer layer 116, conductive layer 118, and absorber layer 120 of FIG. 1A. FIG. 2A differs from FIG. 1A in the presence of the conductive layer 221 in FIG. 2A The conductive layer 221 of FIG. 2A has the same geometric properties (e.g., thickness) and material properties as does the conductive layer 218. Aside for the conductive layer 221, the discussion supra of FIG. 1A applies to FIG. 2A. The conductive layer 221 is advantageous, in conjunction with the etching of the buffer layer 216 as depicted by FIG. 2F, if the etching of the buffer layer 216 is not selective with respect to the absorber layer 220; so that the conductive layer 221 protects the absorber layer 220 from being damaged during the etching of the buffer layer 216.

Figure 2B:
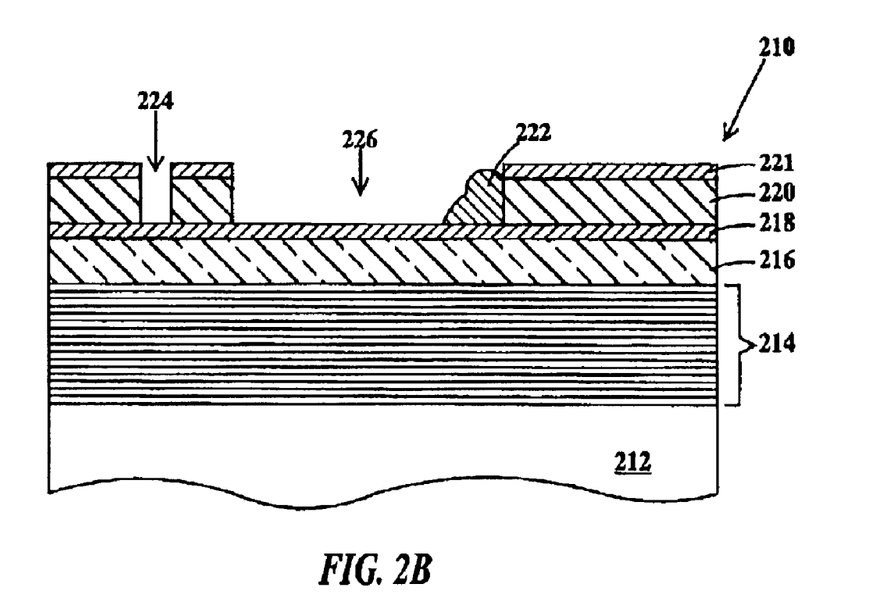
FIG. 2B depicts the EUVL mask structure of FIG. 2A after transfer of a mask pattern to the second conductive layer and into the absorber layer such that defects have inadvertently created in the absorber layer, in accordance with second embodiments of the present invention.

FIG. 2B depicts the EUVL mask structure 210 of FIG. 2A after transfer of a mask pattern to the absorber layer 220 such that defects have been inadvertently created in the absorber layer 220, in accordance with second embodiments of the present invention. The space pattern 226, clear defect 224, and opaque defect 222 of FIG. 2B respectively correspond (with respect to geometry, materials and material properties, functionality, etc.) to the space pattern 126, clear defect 124, and opaque defect 122 of FIG. 1B. In FIG. 2B, a mask pattern has been transferred to the conductive layer 221 and the absorber layer 220 in a manner that is analogous to the transfer of a mask pattern to absorber layer 120 in FIG. 1B as described supra. In FIG. 2B, the mask pattern that has been transferred to the conductive layer 221 and the absorber layer 220 includes the space pattern 226. Aside for the conductive layer 221, the discussion supra of FIG. 1B applies to FIG. 2B. Additionally, use of photolithography in FIG. 2B for initiating formation of the space pattern 226 requires placement of the photoresist layer on the conductive layer 221 in FIG. 2B, in contrast with placement of the photoresist layer on the absorber layer 120 in FIG. 1B. Formation of the space pattern 226 in the conductive layer 221 may utilize any etching method described supra for etching the conductive layer 118 of FIG. 1B.

Figure 2C:
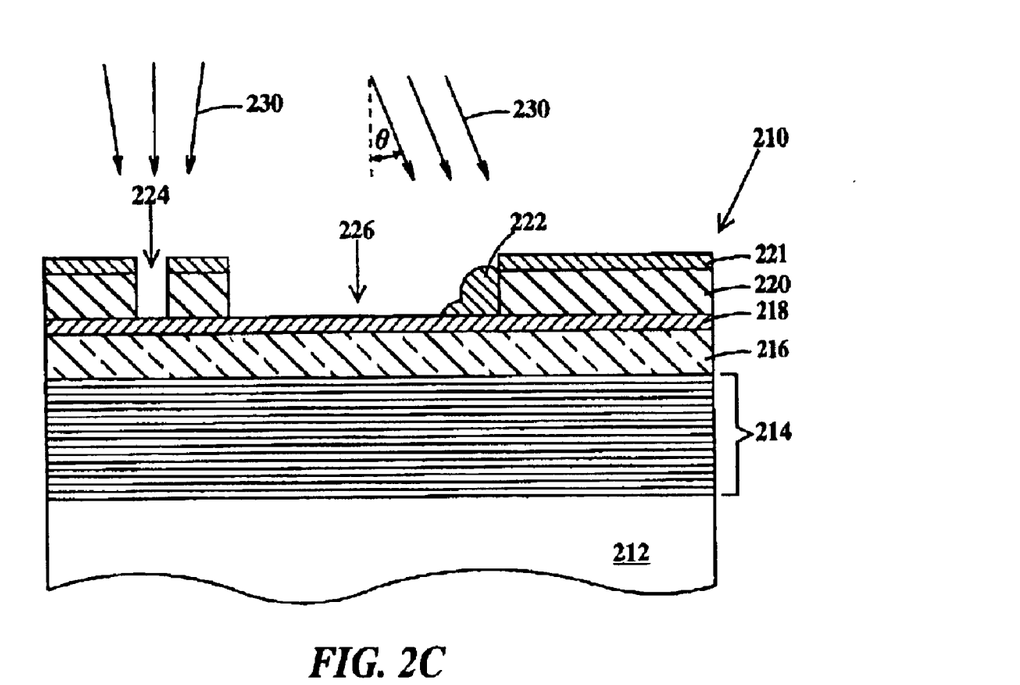
FIG. 2C depicts the EUVL mask structure of FIG. 2B with a focused ion beam for repair of the defects, in accordance with second embodiments of the present invention.

FIG. 2C depicts the EUVL mask structure 210 of FIG. 2B with focused ion beam for repair of the clear defect 224 and the opaque defect 222, in accordance with second embodiments of the present invention. The focused ion beam 230 of FIG. 2C corresponds to the focused ion beam 130 of FIG. 1C. Aside for the conductive layer 221, the discussion supra of FIG. 1C applies to FIG. 2C.

Figure 2D:
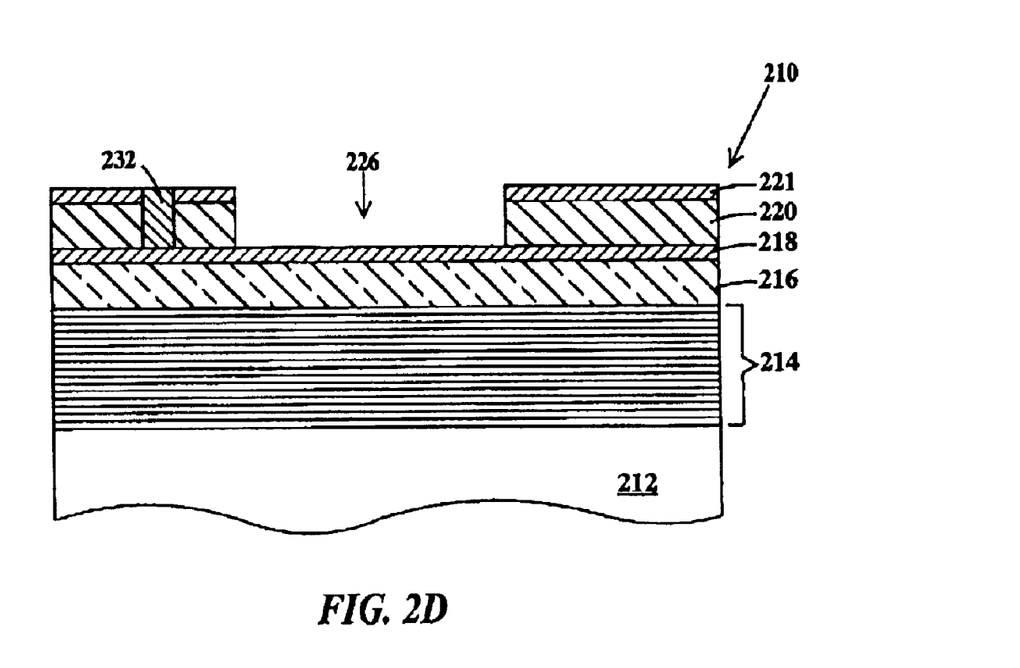
FIG. 2D depicts the EUVL mask structure of FIG. 2C after repair of the defects, in accordance with second embodiments of the present invention.

FIG. 2D depicts the EUVL mask structure 210 of FIG. 2C after repair of the clear defect 224 and the opaque defect 222, in accordance with second embodiments of the present invention. The repair material 232 of FIG. 2D corresponds to the repair material 132 of FIG. 1D. Aside for the conductive layer 221, the discussion supra of FIG. 1D applies to FIG. 2D.

Figure 2E:
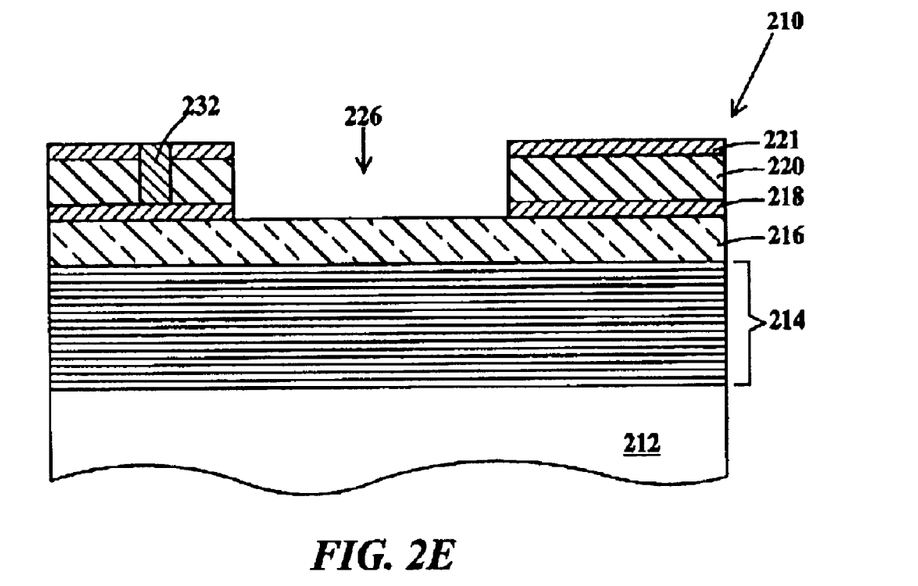
FIG. 2E depicts the EUVL mask structure of FIG. 2D after extension of the mask pattern into the first conductive layer, in accordance with second embodiments of the present invention.
Figure 2F:
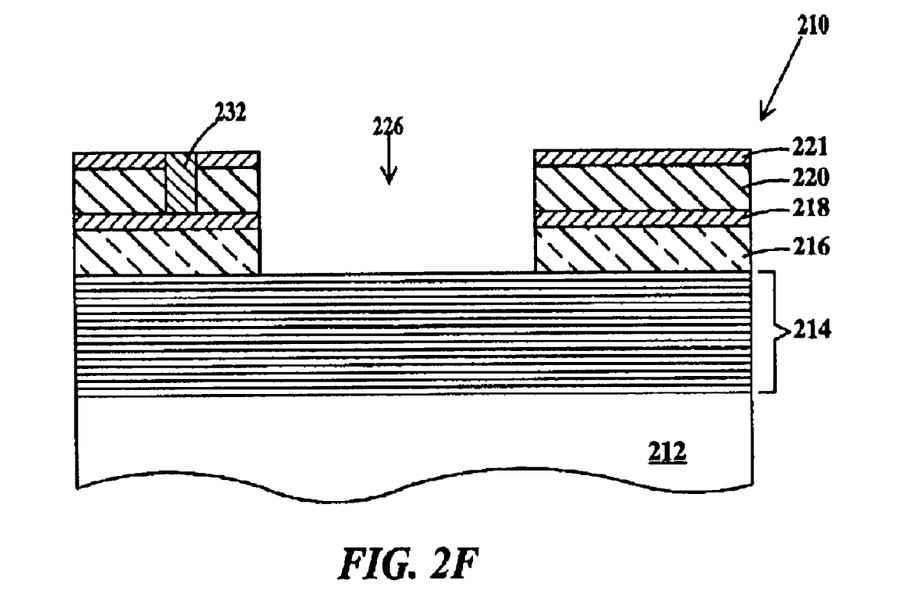
FIG. 2F depicts the EUVL mask structure of FIG. 2E after extension of the mask pattern into the buffer layer such that a portion of the multilayer stack is exposed, in accordance with second embodiments of the present invention.

FIG. 2E depicts the EUVL mask structure 210 of FIG. 2D after extension of the mask pattern that includes the space pattern 226 into the conductive layer 218, by wet etching or dry etching (e.g., RIE) as discussed supra in conjunction with FIG. 1A, in accordance with second embodiments of the present invention. Said etching of the conductive layer 218 may be selective with respect to the absorber region 220 in order to avoid damage to the absorber region 220.

FIG. 2F depicts the EUVL mask structure 210 of FIG. 1E after extension of the mask pattern that includes the space pattern 226 into the non-conductive buffer layer 216 such that a portion of the multilayer stack 214 is exposed, in accordance with second embodiments of the present invention. Aside for the conductive layer 221, the discussion supra of FIG. 1F applies to FIG. 2F.

After the mask pattern that includes the space pattern 226 has been extended into the buffer layer 216 such that a portion of the multilayer stack 214 is exposed as depicted in FIG. 2F, the mask structure 210 has become an EUVL mask that is essentially defect free.

In the second embodiments of FIGS. 2A–2F, the conductive layer 221 may be advantageous if the etching of the buffer layer 216 is not selective with respect to the absorber layer 220; so that the conductive layer 221 protects the absorber layer 220 from being damaged during the etching of the buffer layer 216.

Figure 3A:
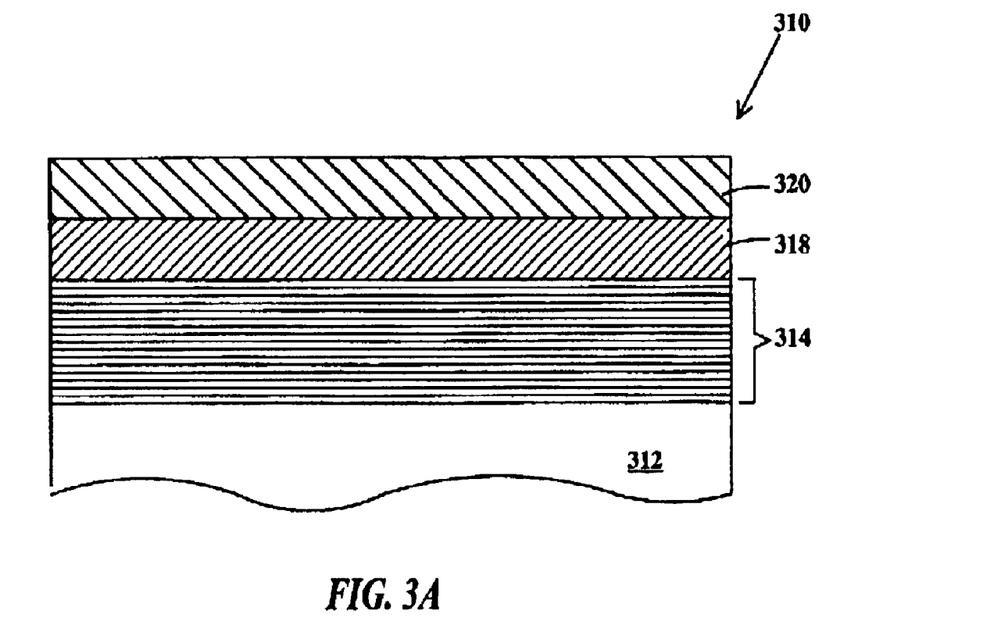
FIG. 3A depicts a front cross-sectional view of an EUVL mask structure comprising a multilayer stack on a substrate, a conductive layer on the multilayer stack, and an absorber layer on the conductive layer, in accordance with third embodiments of the present invention.

FIG. 3A depicts a front cross-sectional view of an EUVL mask structure 310 comprising a multilayer stack 314 on a substrate 312, a conductive layer 318 on the multilayer stack 314, and an absorber layer 320 on the conductive layer 318, in accordance with third embodiments of the present invention. The substrate 312, multilayer stack 314, conductive layer 318, and absorber layer 320 of FIG. 3A respectively correspond with respect to geometry, materials and material properties, functionality, etc. to the substrate 112, multilayer stack 114, conductive layer 118, and absorber layer 120 of FIG. 1A. FIG. 3A differs from FIG. 1A in the absence of a layer that parallels the buffer layer 116 of FIG. 1A. In FIG. 3A, the conductive layer 318 also functions as a buffer layer between the absorber layer 320 and the multilayer stack 314. Thus, the conductive layer 318 of FIG. 3A provides the functionality of both the buffer layer 116 and the conductive layer 118 of FIGS. 1A–1F to prevent charge accumulation during imaging and repair. The conductive layer 318 also assumes some of the functionality of the absorber layer 320 since conductors are often good EUV absorbers. This additional EUV absorption permits a thinner absorber layer 320 which has printing advantages. In effect, the absorber layer 320 becomes a "hard mask". Aside from the absence of the buffer layer 116 and the aforementioned enhanced role of the conductive layer 318, the discussion supra of FIG. 1A applies to FIG. 3A.

Figure 3B:
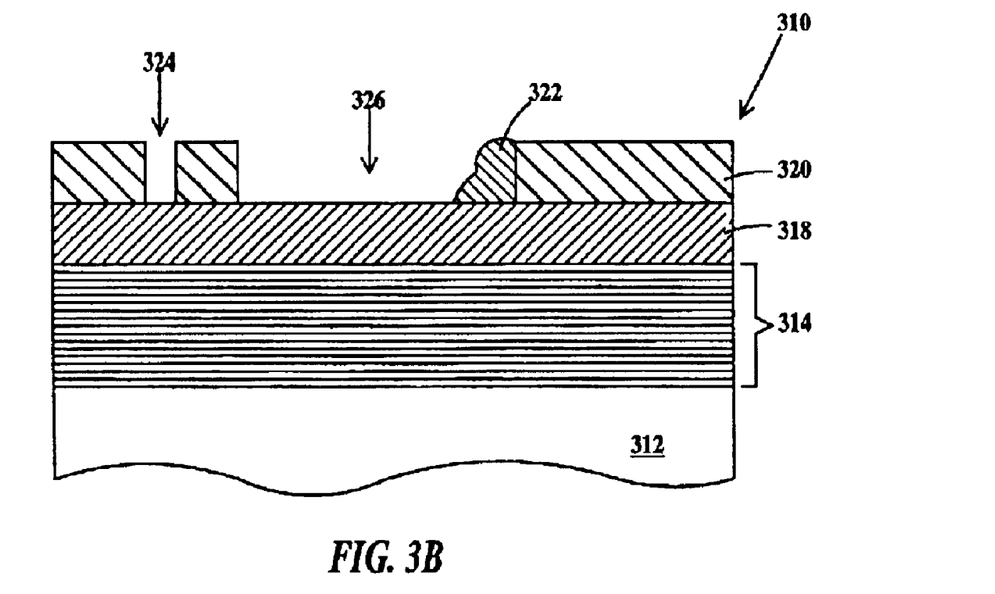
FIG. 3B depicts the EUVL mask structure of FIG. 3A after transfer of a mask pattern to the absorber layer such that defects have been inadvertently created in the absorber layer, in accordance with third embodiments of the present invention.

FIG. 3B depicts the EUVL mask structure 310 of FIG. 3A after transfer of a mask pattern to the absorber layer 320 such that defects have been inadvertently created in the absorber layer 220, in accordance with third embodiments of the present invention. The space pattern 326, clear defect 324, and opaque defect 322 of FIG. 3B respectively correspond (with respect to geometry, materials and material properties, functionality, etc.) to the space pattern 126, clear defect 124, and opaque defect 122 of FIG. 1B. In FIG. 3B, a mask pattern has been transferred to the absorber layer 320 in a manner that is analogous to the transfer of a mask pattern to absorber layer 120 in FIG. 1B as described supra. In FIG. 3B, the mask pattern that has been transferred to the absorber layer 320 includes the space pattern 326. Aside for the absence of the buffer layer 116 and the aforementioned enhanced role of the conductive layer 318, the discussion supra of FIG. 1B applies to FIG. 3B.

Figure 3C:
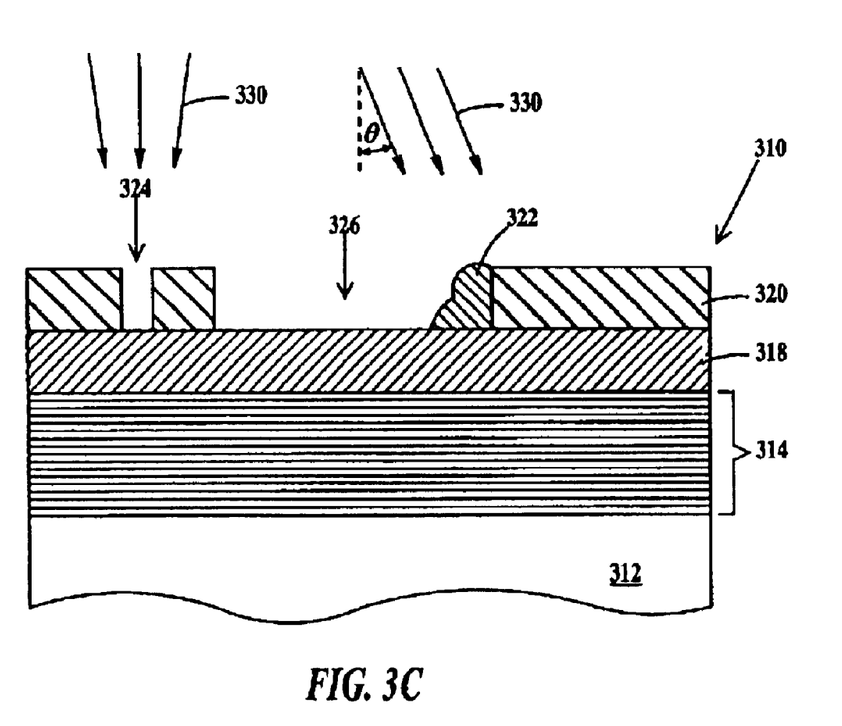
FIG. 3C depicts the EUVL mask structure of FIG. 3B with a focused ion beam for repair of the defects, in accordance with third embodiments of the present invention.

FIG. 3C depicts the EUVL mask structure 310 of FIG. 3B with focused ion beam for repair of the clear defect 324 and the opaque defect 322, in accordance with third embodiments of the present invention. The focused ion beam 330 of FIG. 3C corresponds to the focused ion beam 130 of FIG. 1C. Aside for the absence of the buffer layer 116 and the aforementioned enhanced role of the conductive layer 318, the discussion supra of FIG. 1C applies to FIG. 3C.

Figure 3D:
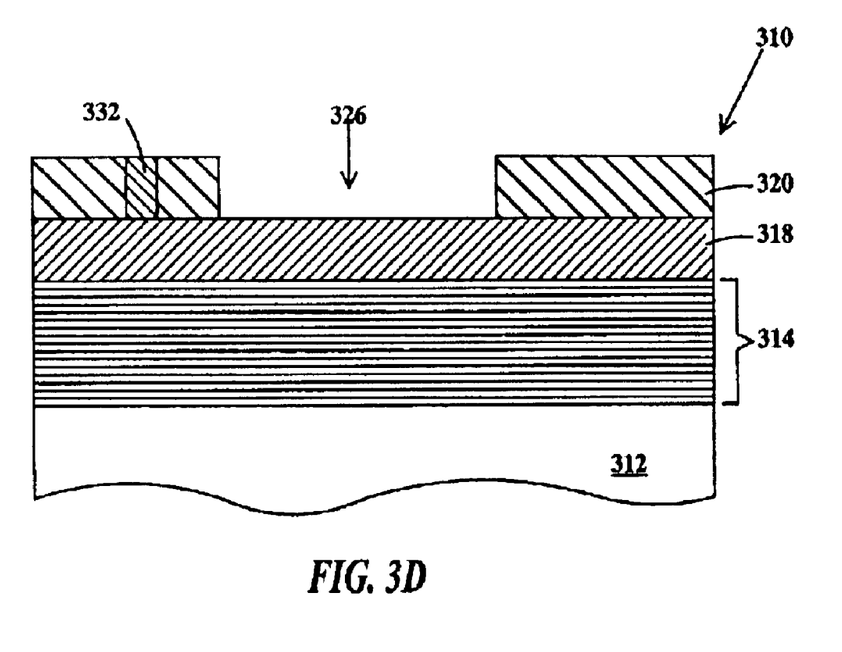
FIG. 3D depicts the EUVL mask structure of FIG. 3C after repair of the defects, in accordance with third embodiments of the present invention.

FIG. 3D depicts the EUVL mask structure 310 of FIG. 3C after repair of the clear defect 324 and the opaque defect 322, in accordance with third embodiments of the present invention. The repair material 332 of FIG. 3D corresponds to the repair material 132 of FIG. 1D. Aside for the absence of the buffer layer 116 and the aforementioned enhanced role of the conductive layer 318, the discussion supra of FIG. 1D applies to FIG. 3D.

Figure 3E:
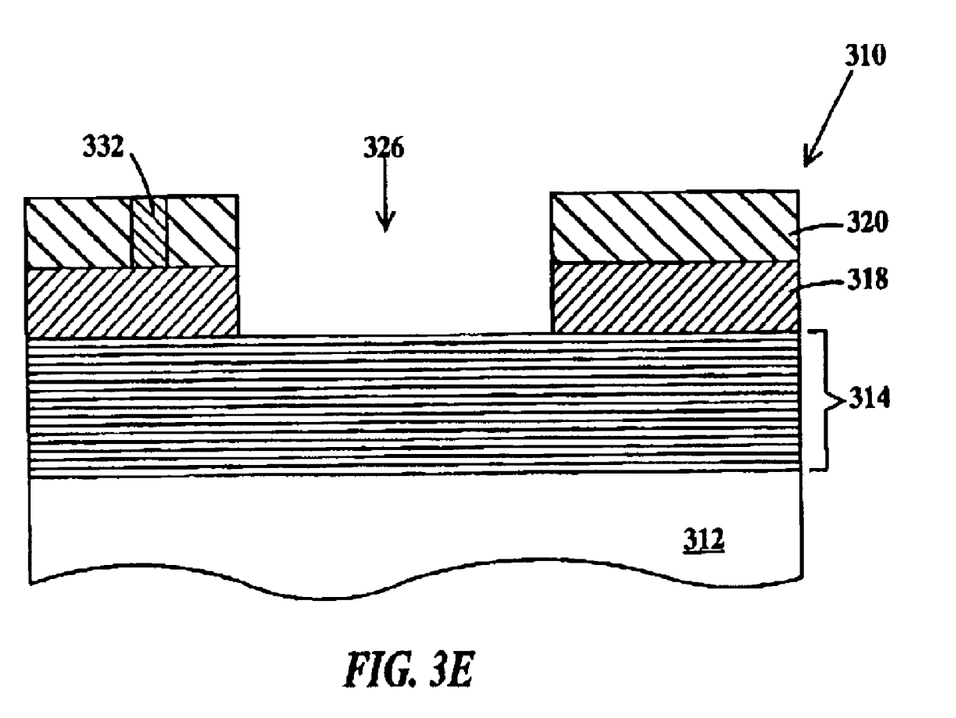
FIG. 3E depicts the EUVL mask structure of FIG. 3D after extension of the mask pattern into the conductive layer such that a portion of the multilayer stack is exposed, in accordance with third embodiments of the present invention.

FIG. 3E depicts the EUVL mask structure 310 of FIG. 3D after extension of the mask pattern that includes the space pattern 326 into the conductive layer 318 such that a portion of the multilayer stack 314 is exposed, in accordance with third embodiments of the present invention. Said extension of the mask pattern into the conductive layer 318 may be by any process known to one of ordinary skill in the art such as by, inter alia, a wet etch or a dry etch such as RIE. Said etching into the conductive layer 318 may be selective with respect to the absorber region 320 in order to avoid damage to the absorber region 320 or to avoid compromising the size or quality of the space pattern 326.

After the mask pattern that includes the space pattern 326 has been extended into the conductive layer 318 such that a portion of the multilayer stack 314 is exposed as depicted in FIG. 3E, the mask structure 310 has become an EUVL mask that is essentially defect free.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of forming an extreme ultraviolet lithography (EUVL) mask structure, comprising:
providing a first conductive layer between a buffer layer and an absorber layer such that the buffer layer is on a multilayer stack that is adapted to substantially reflect EUV radiation incident thereon, and wherein the absorber layer is adapted to absorb essentially all of EUV radiation incident thereon;
forming a mask pattern in the absorber layer accompanied by inadvertent formation of a defect in the absorber layer; and
repairing the defect.

2. The method of claim 1, wherein repairing the defect includes directing a beam of charged particles into the absorber layer and toward the first conductive layer, and wherein the first conductive layer shields the buffer layer from electric charge accumulation.

3. The method of claim 1, wherein repairing the defect includes directing a laser beam into the absorber layer.

4. The method of claim 1, wherein the first conductive layer has a thickness between about 50 Å and about 100 Å.

5. The method of claim 1, further comprising after repairing the defect extending the mask pattern into the first conductive layer and into the buffer layer in a substantially defect-free process that exposes a portion of the multilayer stack.

6. The method of claim 5, wherein extending the mask pattern into the first conductive layer and into the buffer layer comprises:
extending the mask pattern into the first conductive layer by an etch method that is selective with respect to the buffer layer; and
extending the mask pattern into the buffer layer.

7. The method of claim 1, further comprising providing a second conductive layer on the absorber layer, wherein forming the mask pattern comprises forming the mask pattern in the second conductive layer.

8. The method of claim 7, further comprising after repairing the defect extending the mask pattern into the first conductive layer and into the buffer layer in a substantially defect-free process that exposes a portion of the multilayer stack, wherein said extending the mask pattern into the buffer layer is by an etch method that is not selective with respect to the absorber material.

9. An extreme ultraviolet lithography (EUVL) mask structure, comprising:
a multilayer stack adapted to substantially reflect EUV radiation incident thereon; and
a first conductive layer between a buffer layer and an absorber layer such that the buffer layer is on the multilayer stack, wherein the absorber layer includes a mask pattern such that a portion of the first conductive layer is exposed, and wherein the absorber layer is adapted to absorb essentially all of EUV radiation incident thereon.

10. The EUVL mask structure of claim 9, wherein the absorber layer comprises a defect, and wherein the first conductive layer is adapted to prevent the buffer layer from accumulating electric charge when the defect is subsequently repaired by a beam of charged particles directed into the absorber layer and toward the buffer layer.

11. The EUVL mask structure of claim 9, wherein the first conductive layer has a thickness between about 5 Å and about 1000 Å.

12. The EUVL mask structure of claim 9, wherein the first conductive layer has a thickness between about 50 Å and about 100 Å.

13. The EUVL mask structure of claim 9, further comprising a second conductive layer on the absorber layer, wherein the second conductive layer includes the mask pattern such that the portion of the first conductive layer is exposed.

14. The EUVL mask structure of claim 13, wherein the second conductive layer has a thickness between about 50 Å and about 100 Å.

15. An extreme ultraviolet (EUV) mask, comprising:
a multilayer stack adapted to substantially reflect EUV radiation incident thereon; and
a first conductive layer between a buffer layer and an absorber layer such that the buffer layer is on the multilayer stack, wherein a mask pattern in each of the absorber layer, first conductive layer, and buffer layer collectively exposes a portion of the multilayer stack, wherein the absorber layer is adapted to absorb essentially all of EUV radiation incident thereon, and wherein the absorber layer, first conductive layer, and buffer layer are essentially defect free.

16. The EUVL mask of claim 15, wherein the absorber layer and the first conductive layer have a combined thickness not exceeding about 1000 Å.

17. The EUVL mask structure of claim 15, wherein the first conductive layer has a thickness between about 50 Å and about 100 Å.

18. The EUVL mask of claim 15, further comprising a second conductive layer on the absorber layer, wherein the second conductive layer includes the mask pattern, and wherein the mask pattern in the second conductive layer, absorber layer, first conductive layer, and buffer layer collectively exposes the portion of the multilayer stack.

19. The EUVL mask of claim 18, wherein the second conductive layer has a thickness between about 50 Å and about 100 Å.

20. The EUVL mask of claim 18, wherein the first conductive layer and the second conductive layer include a same conductive material.

* * * * *